United States Patent
Lee et al.

(10) Patent No.: US 7,582,931 B2
(45) Date of Patent: Sep. 1, 2009

(54) RECESSED GATE ELECTRODES HAVING COVERED LAYER INTERFACES AND METHODS OF FORMING THE SAME

(75) Inventors: Byung-Hak Lee, Gyeonggi-do (KR); Chang-Won Lee, Gyeonggi-do (KR); Hee-Sook Park, Seoul (KR); Woong-Hee Sohn, Seoul (KR); Sun-Pil Youn, Seoul (KR); Jong-ryeol Yoo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 376 days.

(21) Appl. No.: 11/144,142

(22) Filed: Jun. 3, 2005

(65) Prior Publication Data
US 2005/0272233 A1 Dec. 8, 2005

(30) Foreign Application Priority Data

Jun. 4, 2004 (KR) ............... 2004-40990
Jan. 18, 2005 (KR) ............... 10-2005-0004616

(51) Int. Cl.
*H01L 29/76* (2006.01)
(52) U.S. Cl. ............... 257/330; 257/288; 257/328; 257/332; 257/388; 257/E29.201
(58) Field of Classification Search ............... 257/330
See application file for complete search history.

(56) References Cited

U.S. PATENT DOCUMENTS

| | | | | |
|---|---|---|---|---|
| 5,282,018 | A  * | 1/1994 | Hiraki et al. | 257/296 |
| 6,274,905 | B1 * | 8/2001 | Mo | 257/330 |
| 6,710,402 | B2 * | 3/2004 | Harada | 257/330 |
| 6,774,439 | B2 * | 8/2004 | Fukuzumi et al. | 257/360 |
| 6,815,767 | B2 * | 11/2004 | Nakamura et al. | 257/330 |
| 6,849,899 | B2 * | 2/2005 | Hshieh et al. | 257/332 |
| 2003/0227050 | A1 * | 12/2003 | Yoshimochi | 257/330 |

FOREIGN PATENT DOCUMENTS

| | | |
|---|---|---|
| JP | 07-153952 | 6/1995 |
| JP | 10-173072 | 6/1998 |
| JP | 2001-044435 | 2/2001 |
| JP | 2001-284587 | 10/2001 |

* cited by examiner

*Primary Examiner*—Kenneth A Parker
*Assistant Examiner*—Jose R Diaz
(74) *Attorney, Agent, or Firm*—Myers Bigel Sibley & Sajovec, P.A.

(57) ABSTRACT

A gate electrode of a transistor can include an interface between a polysilicon conformal layer and a tungsten layer thereon in a trench in a substrate and a capping layer extending across the trench and covering the interface. Related methods are also disclosed.

5 Claims, 6 Drawing Sheets

RECESSED GATE ELECTRODES HAVING COVERED LAYER INTERFACES AND METHODS OF FORMING THE SAME

CROSS-REFERENCE TO RELATED APPLICATIONS

This application claims priority under 35 U.S.C. § 119, to Korean Patent Application Nos. 2004-40990 filed on Jun. 4, 2004 and 2005-04616 filed on Jan. 18, 2005, the entire contents of which are incorporated herein by reference.

FIELD OF THE INVENTION

The invention relates to semiconductor devices in general, and more particularly, to oxidation of gate electrodes in semiconductor devices.

BACKGROUND

Low resistance metals have been adopted for use in gate electrodes to enhance operational speed as the size of such transistors is scaled-down (i.e., reduced). Tungsten is a suitable material for use in such low resistance gates because the tungsten may not be transformed in a subsequent thermal process, and the diffusion of tungsten through insulating layers may be less. Compared with conventional polycide gate electrodes, polymetal gates including tungsten may have low resistivity and be less affected by line-width.

FIGS. 1 to 3 are cross-sectional views illustrating a conventional transistor and a method for fabricating the same. Referring to FIG. 1, a device isolation layer 12 is formed on a semiconductor substrate 10 to define an active region. In a conventional Dynamic Random Access Memory (DRAM) device, the device isolation layer 12 defines a plurality of isolated active regions, and the active regions are arranged over the length and width of the substrate 10. A gate insulating layer 16 is on an upper portion of the active region.

A gate electrode 28 is on the gate insulating layer 16 and includes a silicon layer 18 and a tungsten layer 22. An adhesion layer 20 formed of a metal nitride layer can be between the silicon layer 18 and the tungsten layer 22. The silicon layer 18 may be polysilicon or amorphous silicon. The adhesion layer 20 enhances adhesion between silicon and tungsten, and may also function as an ohmic layer. A capping layer 24 is formed on an upper portion of the tungsten layer 22.

Referring to FIG. 2, the gate electrode 28 is formed by patterning the silicon layer, the adhesion layer 20, the tungsten layer 22, and the capping layer 24. When the silicon layer 18 is etched, there is a possibility that a surface of the gate electrode 28 may be adversely effected. A thermal oxidation process may be used to cure the surface defects on the silicon layer created by the etch. The thermal oxidation process may cause a sidewall of the silicon layer 18 to be oxidized to form a thermal oxide layer 26 thereon. Oxidizing the gate electrode 28 may cause an increase in the parasitic capacitance and resistance associated with the transistor.

Referring to FIG. 3, a LDD layer (not shown) in the substrate at both sides of the gate electrode 28 is formed by curing the defects and applying an ion implantation process. Then, a sidewall spacer 30 is formed on sidewalls of the gate electrode 28 and, impurities are implanted into the substrate to form high concentration source/drain (not shown).

In the case of a polymetal gate electrode including a silicon layer and a metal layer in a transistor fabrication process, tungsten may be used to replace tungsten silicide or a multilayered structure including an adhesion layer and a tungsten layer.

SUMMARY

Embodiments according to the invention can provide recessed gate electrodes having covered layer interfaces and methods of forming the same. Pursuant to these embodiments, a gate electrode of a transistor can include an interface between a polysilicon conformal layer and a tungsten layer thereon in a trench in a substrate and a capping layer extending across the trench and covering the interface.

In some embodiments according to the invention, the polysilicon conformal layer includes a first surface facing outside the trench and a second surface facing inside the trench. In some embodiments according to the invention, the transistor further includes an adhesion layer in the trench between the polysilicon conformal layer and the tungsten layer. In some embodiments according to the invention, the transistor further includes a thermal oxidation layer on the first surface facing outside the trench.

In some embodiments according to the invention, the transistor further includes a spacer on a sidewall of the capping layer and extending onto the thermal oxidation layer. In some embodiments according to the invention, the first surface extends above an opening of the trench a first distance to provide an oxidation surface for the thermal oxidation layer.

In some embodiments according to the invention, the transistor can include a trench in a substrate and a polysilicon conformal layer, in the trench, including a first surface facing outside the trench and a second surface facing inside the trench defining a recess inside the trench. A tungsten layer is in the recess on the polysilicon conformal layer and defines an interface with the second surface outside an opening of the trench. A thermal oxide layer is on the first surface of the polysilicon conformal layer and a capping layer extends across the trench and covering the interface. A spacer is adjacent to the capping layer on a sidewall thereof covering the thermal oxide layer and the sidewall of the capping layer.

In some embodiments according to the invention, a gate electrode further includes a gate insulating layer between the polysilicon conformal layer and the trench, wherein the gate insulating layer is formed of a silicon oxide layer, a hafnium oxide layer (HfO), an aluminum oxide layer ($Al_2O_3$), a zirconium oxide layer (ZrO), a tantalum oxide layer ($Ta_2O_5$), a titanium oxide layer ($TiO_2$), and/or a hafnium silicon oxide layer (HfSio).

In some embodiments according to the invention, a method of forming a transistor includes forming an interface between a polysilicon conformal layer and a tungsten layer thereon in a trench in a substrate and forming a capping layer extending across the trench and covering the interface.

In some embodiments according to the invention, the method further includes forming an adhesion layer in the trench between the polysilicon conformal layer and the tungsten layer. In some embodiments according to the invention, the polysilicon conformal layer includes a first surface facing outside the trench and a second surface facing inside the trench and the method further includes forming a thermal oxidation layer on the first surface facing outside the trench.

In some embodiments according to the invention, the method further includes forming a spacer on a sidewall of the capping layer and extending onto the thermal oxidation layer. In some embodiments according to the invention, the method includes forming a trench in a substrate; and conformally forming a polysilicon layer to provide a polysilicon conformal layer in the trench defining a recess in the trench above the polysilicon conformal layer. A tungsten layer is formed in the recess to form an upper surface that includes an interface between the polysilicon conformal layer and the tungsten layer that extends outside the trench. A capping layer is formed on the tungsten layer extending across the trench and covering the interface.

In some embodiments according to the invention, the method further includes patterning the substrate to remove portions of the polysilicon conformal layer and portions of the tungsten layer outside the trench to expose a sidewall of the capping layer and a portion of a surface of the polysilicon conformal layer that faces outside the trench.

In some embodiments according to the invention, the method further includes oxidizing the exposed portion of the surface of the polysilicon conformal layer to form a thermal oxidation layer thereon. In some embodiments according to the invention, the thermal oxide layer and the sidewall of the capping layer define a gate electrode sidewall. In some embodiments according to the invention, the method further includes forming a spacer on the gate electrode sidewall. In some embodiments according to the invention, the method further includes forming an adhesion layer between the polysilicon conformal layer and the tungsten layer.

In some embodiments according to the invention, the portion of the surface of the polysilicon conformal layer that faces outside the trench extends above an opening of the trench a first distance to provide an oxidation surface for the thermal oxidation layer.

In some embodiments according to the invention, the method further includes forming a gate insulating layer on a surface of the trench, wherein the gate insulating layer is formed of a silicon oxide layer, a hafnium oxide layer (HfO), an aluminum oxide layer ($Al_2O_3$), a zirconium oxide layer (ZrO), a tantalum oxide layer ($Ta_2O_5$), a titanium oxide layer ($TiO_2$), and/or a hafnium silicon oxide layer (HfSio).

BRIEF DESCRIPTION OF THE DRAWINGS

The accompanying drawings are included to provide a further understanding of the invention, and are incorporated in and constitute a part of this specification. The drawings illustrate exemplary embodiments according to the invention and, together with the description, serve to explain principles of the present invention. In the drawings.

DESCRIPTION OF EMBODIMENTS ACCORDING TO THE INVENTION

Figure 1:
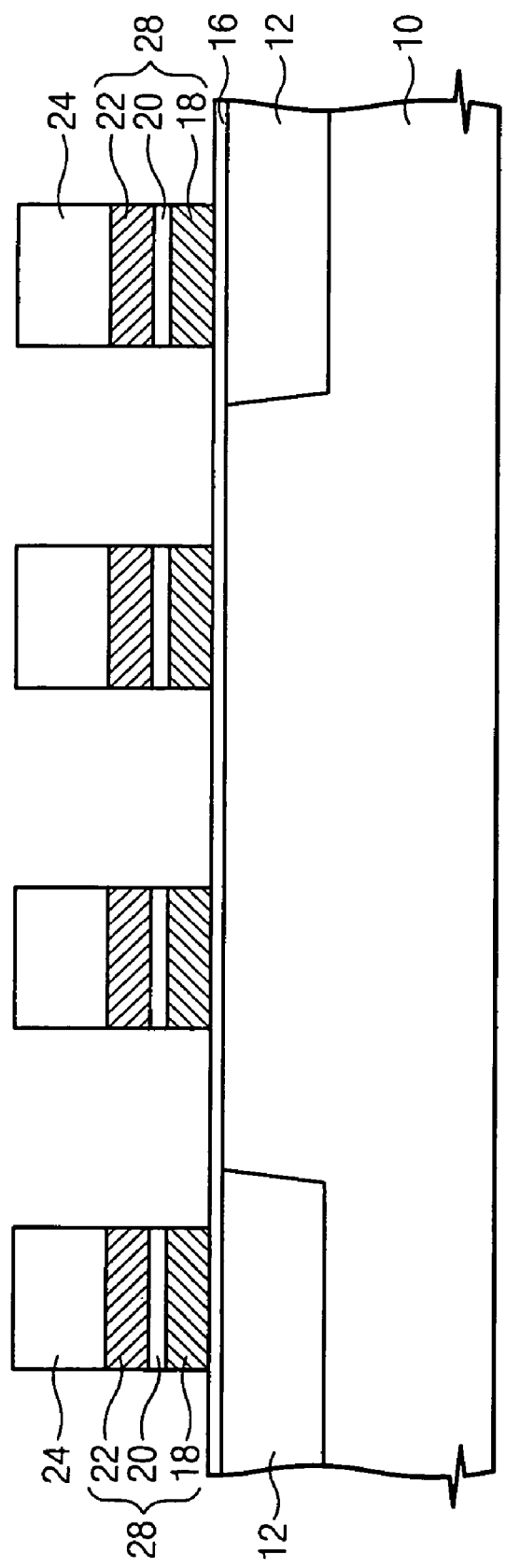
FIGS. 1 to 3 are cross-sectional views illustrating a conventional transistor and a method for fabricating the same.
Figure 2:
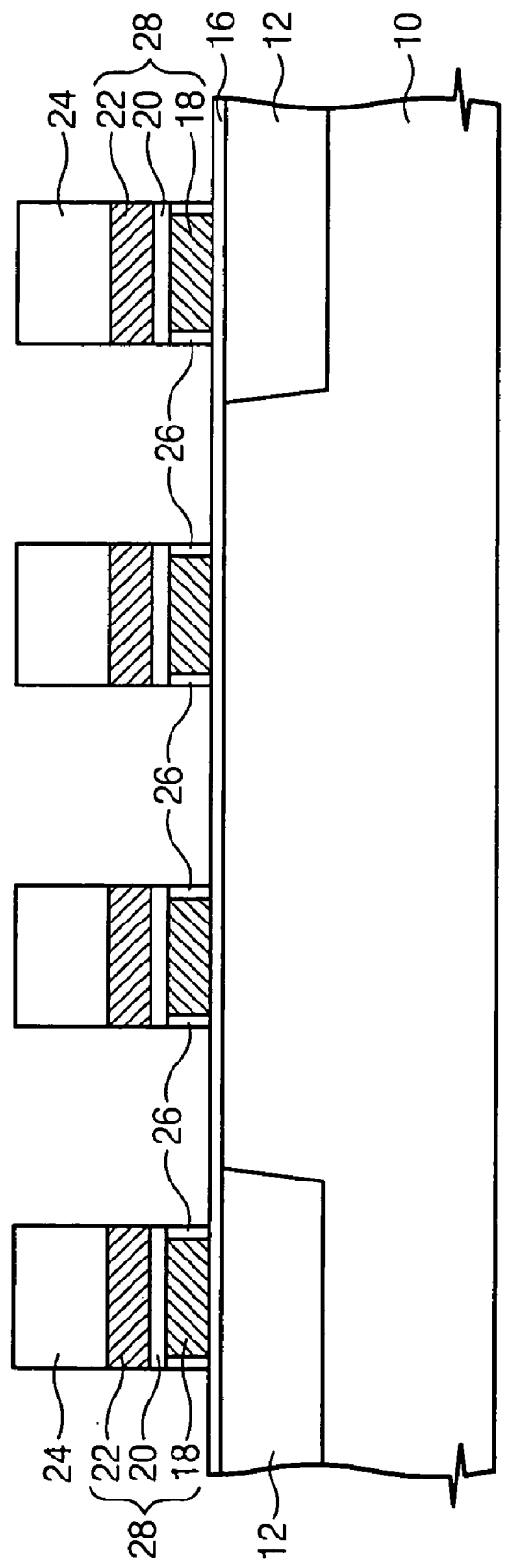
Figure 3:
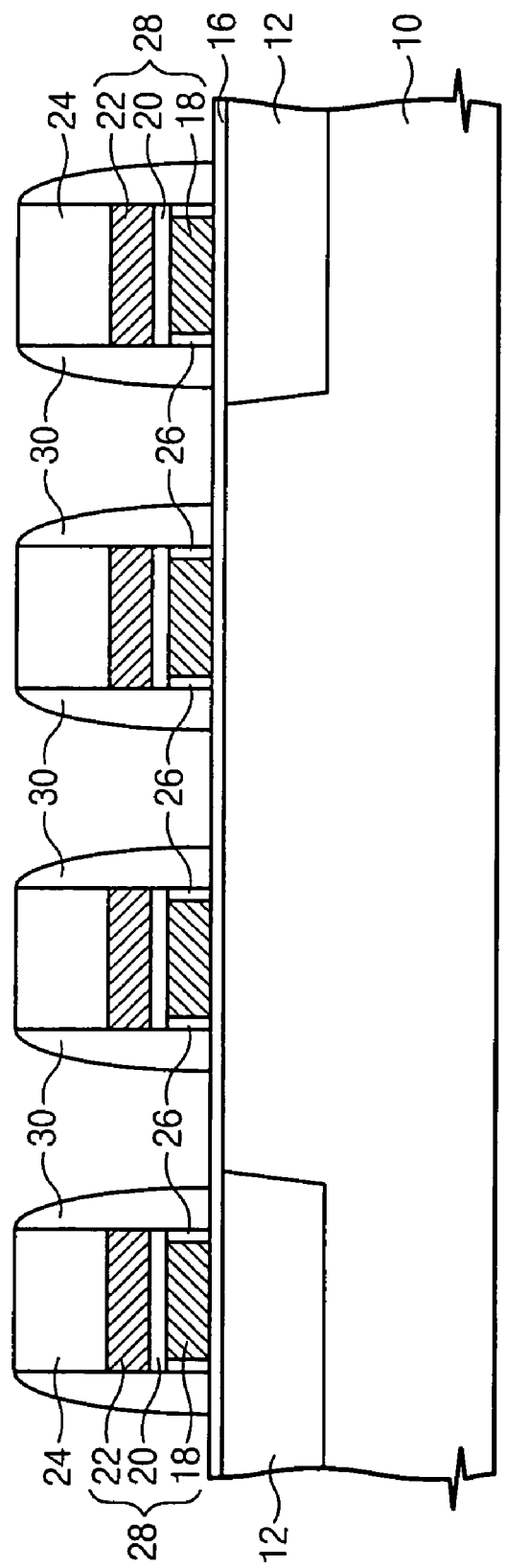

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 4:
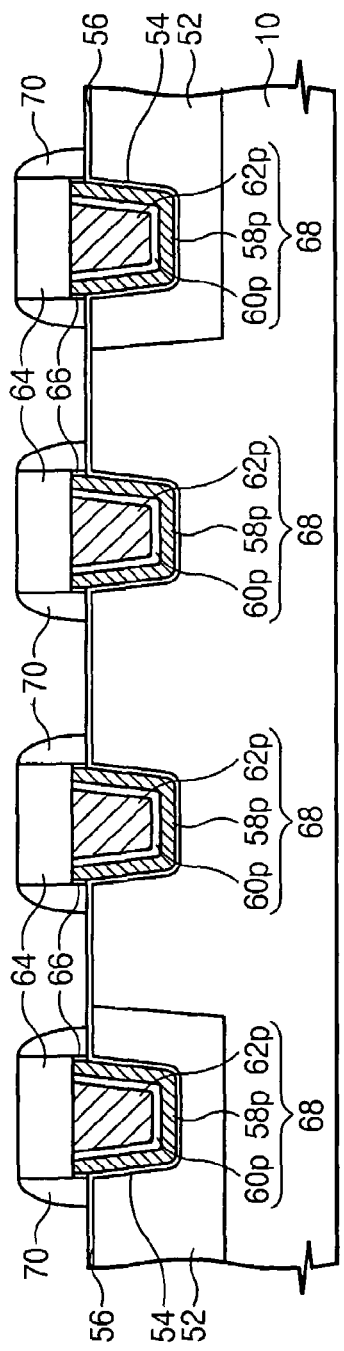
FIG. 4 is a cross-sectional view illustrating a transistor in some embodiments according to the invention.

FIG. 4 a cross-sectional view illustrating a transistor in some embodiments according to the invention. Referring to FIG. 4, a device isolation layer 52 is formed on a substrate 10 to define an active region. A plurality of trenches 54 cross the active region and the device isolation layer 52. A silicon pattern 58p is formed on inner sidewalls of the trench 54 to provide a polysilicon conformal layer including a first surface that faces outside the trench 54 and a second surface that faces inside the trench 54. The silicon pattern 58p has a gap region at a center thereof that defines a recess in the trench 54. A tungsten pattern 62p is in the recess. The polysilicon conformal layer and the tungsten layer define an interface thereof.

In some embodiments according to the invention, an adhesion pattern 60p is between the tungsten pattern 62p and the silicon pattern 58p. A gate insulating layer 56 is between the silicon pattern 58p and the substrate 10. A capping layer is on upper portions of the silicon pattern 58p and the tungsten pattern 62p and extends across the trench 54 to cover the interface. In some embodiments according to the invention, the sections of interfaces between the silicon patterns 58p and the adhesion patterns 60p, and between the tungsten patterns 62p and the adhesion patterns 60p are covered with the capping layers 64. The silicon pattern 58p has sidewalls vertically extending from a surface of the substrate, and a polyoxide layer 66 (i.e., a thermal oxidation layer) is on the sidewalls. In particular, a portion of the first surface extends above an opening of the trench 54 a first distance to provide an oxidation surface for the formation of the thermal oxidation layer thereon.

A spacer oxide layer 70 having inner sidewalls aligned on sidewalls of the capping layer 64 is on the substrate at both sides of the silicon pattern 58p. A gate electrode 68 includes the silicon pattern 58p, the adhesion pattern 60p, and the tungsten pattern 62p. Since the trench 54 is formed toward the active region as well as the device isolation layer, the gate electrode corresponds to the trench 54 and then crosses over the active region and the device isolation layer.

A gate insulating layer 60 is beneath the gate electrode 68 on the substrate 10. In some embodiments according to the invention, the gate insulating layer 56 is a silicon nitride layer or a dielectric layer of high-k dielectric constant. For example, the gate insulating layer 56 may be formed of one of silicon oxide layer, hafnium oxide layer (HfO), an aluminum oxide layer ($Al_2O_3$), a zirconium oxide layer (ZrO), a tantalum oxide layer ($Ta_2O_5$), a titanium oxide layer ($TiO_2$), and hafnium silicon oxide layer (HfSiO), or combination thereof.

Figure 5:
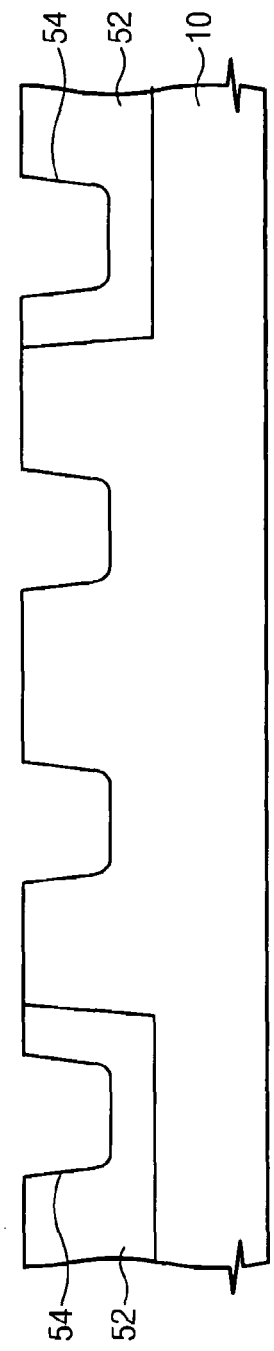
FIGS. 5 to 9 are cross-sectional views illustrating methods of forming transistors in some embodiments according to the invention.

FIGS. 5 to 9 are cross-sectional views illustrating methods of forming transistors in some embodiments according to the invention. Referring to FIG. 5, the device isolation layer 52 is formed on the substrate 10 to define the active region. The substrate of the active region and the device isolation layer 52 are etched to form a trench 54 crossing the active region and the device isolation layer 52. A plurality of active regions are placed in a cell array region and arranged lengthwise and widthwise on the substrate 10. Accordingly, the trench 54 crosses the plurality of active regions and device isolation layers. Moreover, the trenches 54 are formed at positions on the substrate 10 corresponding to where gate electrodes are to be formed.

Figure 6:
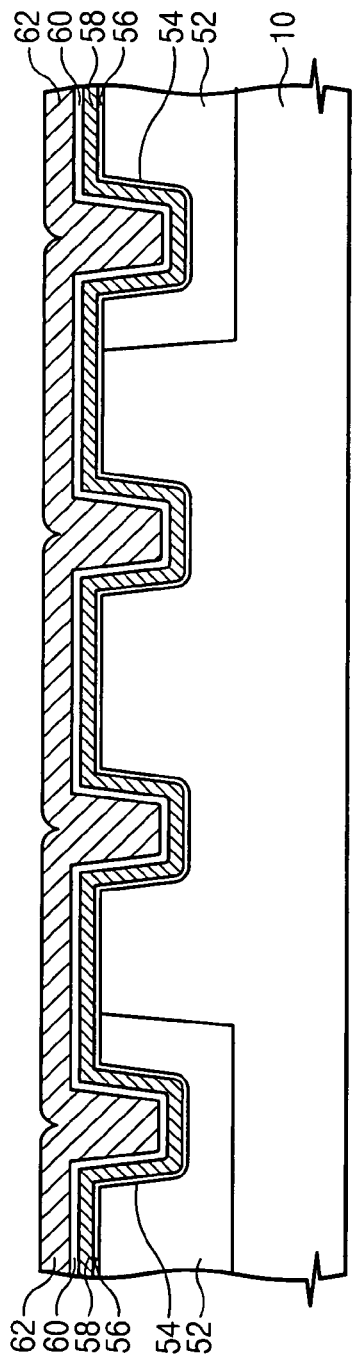

Referring to FIG. 6, a gate insulating layer 56, a silicon layer 58, and a tungsten layer 62 are formed on a surface of the substrate 10. Before forming the gate insulating layer 56, a sacrificial thermal oxide layer is formed and then removed from the surface of the substrate 10 to cure or reduce damage that may be caused by formation of the trenches 54. In some embodiments according to the invention, an adhesion layer 60 is formed between the silicon layer 58 and the tungsten layer 62.

The gate insulating layer 56, the silicon layer 58, and the adhesion layer 60 are conformally formed in the trench 54. Therefore, the silicon layer 58 forms a polysilicon conformal layer that defines a gap region at a center of the trench to provide a recess in which the adhesion layer 60 and a tungsten layer 62 are formed. The gate insulating layer 56 may be formed of a silicon oxide layer or a dielectric layer of a high-k dielectric constant. For example, the gate insulating layer 56 can be silicon oxide layer, hafnium oxide layer (HfO), an aluminum oxide layer ($Al_2O_3$), a zirconium oxide layer (ZrO), a tantalum oxide layer ($Ta_2O_5$), a titanium oxide layer ($TiO_2$), or hafnium silicon oxide layer (HfSiO), or combinations thereof.

In some embodiments according to the invention, the silicon layer 58 is amorphous or polysilicon. In some embodiments according to the invention, the silicon layer is a silicon-germanium layer or a germanium layer. The silicon layer 58 can be n-type or p-type impurity doped.

Figure 7:
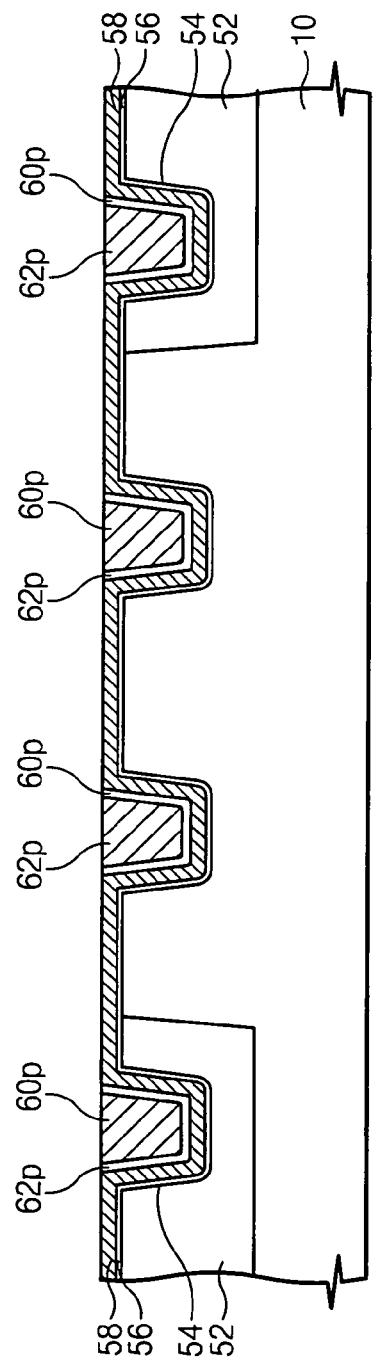

Referring to FIG. 7, the tungsten layer 62 and the adhesion layer 60 are sequentially recessed using chemical mechanical polishing to expose the silicon layer 58, so that the tungsten pattern 62p fills the recess in the trench 54 defined by the silicon layer 58 and the adhesion pattern 60p. The silicon layer 58 and the tungsten layer 62 define an interface thereof above the trench 54.

Figure 8:
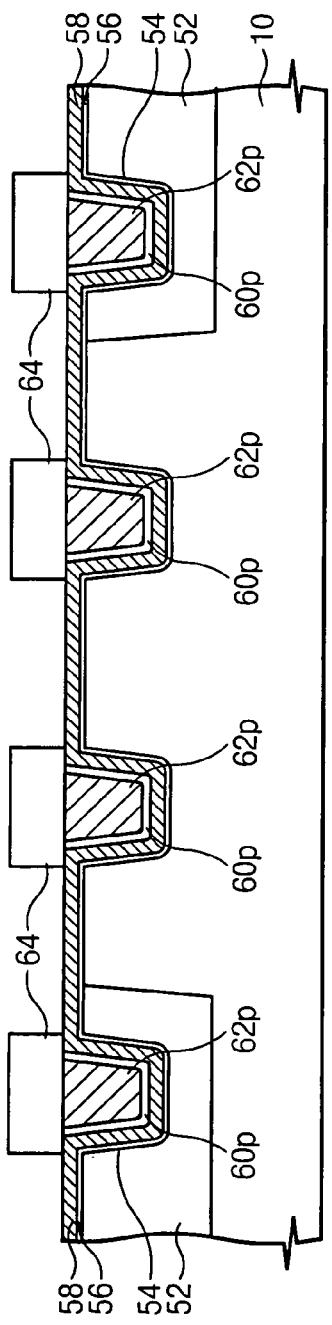

Referring to FIG. 8, a capping layer 64 is formed on an upper portion of the trench to cover the interface. The capping layer 64 may be formed by forming an insulating layer on an entire surface of the substrate and then patterning it.

Figure 9:
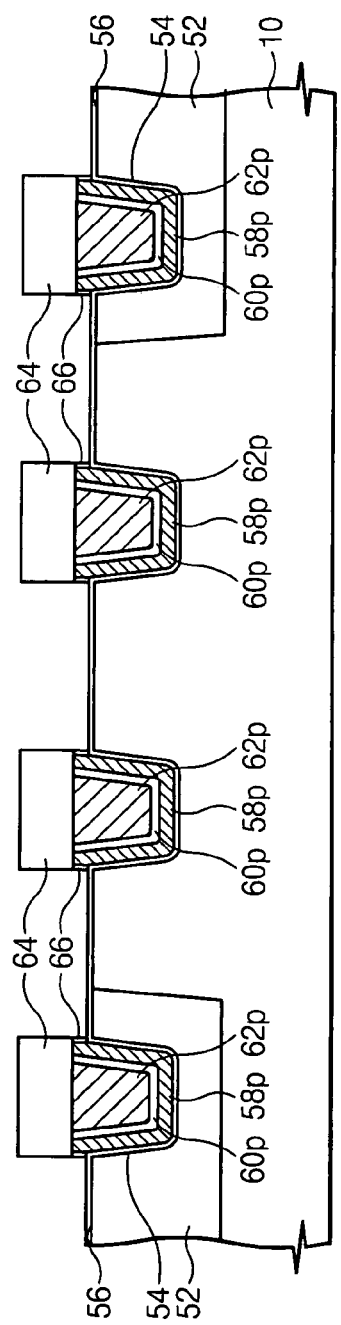

Referring to FIG. 9, after forming the capping layer 64, the substrate (including the silicon layer 58) is patterned to form the silicon pattern 58p aligned at each of the trenches 54. The capping layer 64 and the silicon pattern 58p are sequentially patterned using a photolithography process, or the silicon pattern may be formed using the capping layer as an etch mask after forming the capping layer 64. As a result, a buried gate electrode 68 including the silicon pattern 58p, the adhesion pattern 60p, and tungsten pattern 62p is formed. The buried gate electrode 68 respectively corresponds to the trench to cross over the active region and the device isolation layer.

Patterning the substrate 10 forms the capping layer 64 that extends across the trench and covers the interface as described above. For example, patterning the substrate 10 can remove portions of the polysilicon conformal layer (silicon pattern 58p) and portions of the tungsten layer 62 outside the trench 54 to expose a sidewall of the capping layer 64 and a portion of a surface of the polysilicon conformal layer that faces outside the trench. In particular, a portion of the first surface of the polysilicon conformal layer extends above the opening of the trench 54 a first distance to provide an oxidation surface for the formation of the thermal oxidation layer thereon.

Defects may be created on sidewalls of the silicon pattern 58p that vertically extend toward an upper surface of the substrate. A gate polyoxide layer 66 (i.e., thermal oxidation layer) is formed on the sidewalls of the silicon pattern 58p by applying a thermal process to the substrate 10. Since interfaces between the silicon pattern 58P and the adhesion layer 60p, and between the tungsten pattern 62p and the adhesion layer 60p are covered by the capping layer 64, the diffusion of oxygen into the interfaces may be reduced.

Subsequently, impurities are implanted into the substrate of the active region to form a LDD region (not shown). The sidewall spacer (see 70 of FIG. 4) aligned on sidewalls of the capping layer 64 is formed on the substrate at both sides of the silicon pattern. Impurities are implanted into the active region to form relatively high concentration source/drain regions.

As previously mentioned, interfaces between a polysilicon conformal layer and a tungsten layer are covered with a capping layer. In some embodiments according to the invention, an adhesion layer is located between the tungsten layer and polysilicon conformal layer to define further interfaces, which are also covered by the capping layer. The interfaces can be covered to reduce oxygen diffusion into the interfaces of the silicon pattern during a thermal oxidation process, which may reduce parasitic resistance and capacitance otherwise resulting from oxidation of the silicon pattern. As a result, signal transmission speed may be improved.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A gate electrode of a transistor comprising:
   an interface between a polysilicon conformal layer on an inner wall of a trench in a substrate to provide a recess surrounded by the polysilicon conformal layer and a tungsten layer in the recess, wherein the polysilicon conformal layer extends upwardly from a surface of the substrate to have a protrusion and the protrusion has a vertical outer sidewall adjacent the surface of the substrate;
   a gate insulating layer in the trench between the polysilicon conformal layer and the inner walls of the trench;
   a thermal oxidation layer on the outer sidewall of the protrusion and the gate insulating layer at an edge of the opening of the trench; and
   a capping layer extending across the trench and covering the interface;
   wherein the capping layer is in direct contact with top surfaces of the polysilicon conformal layer and the tungsten layer without any intervening layers.

2. A gate electrode according to claim 1 further comprising:
   an adhesion layer in the trench between the polysilicon conformal layer and the tungsten layer.

3. A gate electrode according to claim 1 further comprising:
   a spacer on a sidewall of the capping layer and extending onto the thermal oxidation layer.

4. A gate electrode according to claim 1, further comprising:
   a gate insulating layer interposed between the polysilicon conformal layer and the trench, wherein the gate insulating layer is formed of a silicon oxide layer, a hafnium oxide layer (HfO), an aluminum oxide layer ($Al_2O_3$), a zirconium oxide layer (ZrO), a tantalum oxide layer ($Ta_2O_5$), a titanium oxide layer ($TiO_2$), and/or a hafnium silicon oxide layer (HfSio).

5. A gate electrode of a transistor comprising:
   a trench in a substrate;
   a gate insulating layer lining the trench;
   a polysilicon conformal layer, in the trench on the gate insulating layer, to provide a recess surrounded by the polysilicon conformal layer, wherein the polysilicon conformal layer extends upwardly from a surface of the substrate to have a protrusion and the protrusion has a vertical outer sidewall adjacent the surface of the substrate;
   a tungsten layer in the recess on the polysilicon conformal layer, wherein the polysilicon conformal layer and the tungsten layer produce an interface therebetween;
   a thermal oxide layer on the outer sidewall of the protrusion and the gate insulating layer at an edge of the opening of the trench;
   a capping layer extending across the trench and covering the interface; and
   a spacer adjacent the capping layer on a sidewall thereof covering the thermal oxide layer and the sidewall of the capping layer;
   wherein the capping layer is in direct contact with top surfaces of the polysilicon conformal layer and the tungsten layer without intervening layers.

* * * * *